United States Patent
Grodzki

(10) Patent No.: US 9,234,951 B2
(45) Date of Patent: Jan. 12, 2016

(54) METHOD AND DEVICE TO GENERATE MAGNETIC RESONANCE IMAGE DATA OF AN EXAMINATION SUBJECT

(71) Applicant: David Grodzki, Erlangen (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 490 days.

(21) Appl. No.: 13/714,861

(22) Filed: Dec. 14, 2012

(65) Prior Publication Data

US 2013/0154641 A1 Jun. 20, 2013

(30) Foreign Application Priority Data

Dec. 14, 2011 (DE) .......................... 10 2011 088 553

(51) Int. Cl.
| | | |
|---|---|---|
| *G01V 3/00* | (2006.01) | |
| *G01R 33/44* | (2006.01) | |
| *G01R 33/46* | (2006.01) | |
| *G01R 33/565* | (2006.01) | |
| *G01R 33/48* | (2006.01) | |

(52) U.S. Cl.
CPC ............ *G01R 33/44* (2013.01); *G01R 33/4625* (2013.01); *G01R 33/56572* (2013.01); *G01R 33/4824* (2013.01)

(58) Field of Classification Search
CPC .................................................. G01R 33/4625
USPC .......................................... 324/309, 307, 314
See application file for complete search history.

(56) References Cited

U.S. PATENT DOCUMENTS

| | | | | |
|---|---|---|---|---|
| 6,380,738 | B1 * | 4/2002 | Zhou .............................. | 324/309 |
| 6,791,323 | B2 * | 9/2004 | Wang et al. ................... | 324/309 |
| 7,348,776 | B1 * | 3/2008 | Aksoy et al. .................. | 324/307 |
| 7,888,935 | B1 | 2/2011 | Tan et al. | |
| 8,040,133 | B2 * | 10/2011 | Pfeuffer et al. ............... | 324/309 |
| 8,154,294 | B2 * | 4/2012 | Takizawa et al. ............. | 324/318 |
| 2006/0253018 | A1 | 11/2006 | Speier et al. | |
| 2011/0234228 | A1 | 9/2011 | Block | |
| 2011/0288398 | A1 | 11/2011 | Park et al. | |

FOREIGN PATENT DOCUMENTS

EP 0 845 684 A1 6/1998

OTHER PUBLICATIONS

Centering the Projection Reconstruction Trajectory: Reducing Gradient Delay Errors, Peters et al., Magnetic Resonance in Medicine, vol. 50 (2003) pp. 1-6.

* cited by examiner

*Primary Examiner* — Louis Arana
(74) *Attorney, Agent, or Firm* — Schiff Hardin LLP

(57) ABSTRACT

In a method, magnetic resonance system and a reconstruction device for generation of magnetic resonance image data of an examination subject, raw magnetic resonance data are acquired in k-space, the raw magnetic resonance data including measurement values at multiple readout points that are arranged along multiple different trajectories in k-space. A displacement value is determined for each trajectory on the basis of the measurement values of a collection of multiple trajectories. Readout points of the raw magnetic resonance data are displaced by the displacement value, and image data are reconstructed from the displaced raw magnetic resonance data.

15 Claims, 7 Drawing Sheets

METHOD AND DEVICE TO GENERATE MAGNETIC RESONANCE IMAGE DATA OF AN EXAMINATION SUBJECT

BACKGROUND OF THE INVENTION

1. Field of the Invention

The present invention concerns a method to generate magnetic resonance image data of an examination subject with the use of a magnetic resonance imaging system, as well as a corresponding reconstruction device and a magnetic resonance imaging system.

2. Description of the Prior Art

Imaging systems that are based on detection of magnetic resonance signals produced by nuclear spins, known as magnetic resonance tomography systems, have been successfully established and proven in a multitude of applications. In this manner of image acquisition, a static basic magnetic field B0 that serves for the initial alignment and homogenization of magnetic dipoles in material to be examined, is superimposed with a rapidly switched magnetic field (known as a gradient field) for spatial resolution of the imaging signal. To determine material properties of an examination subject to be imaged, the dephasing or relaxation time after a deflection of the magnetization out of the initial alignment is determined, such that various relaxation mechanisms or relaxation times that are typical to the material can be identified. The deflection typically takes place with a number of RF pulses, and the spatial resolution is based on a temporally established manipulation of the deflected magnetization with the use of the gradient field, in a series of pulses known as a measurement sequence that establishes a precise chronological order of RF pulses, modification of the gradient field (by a switching sequence of gradient pulses), and the acquisition of measurement values.

If a switching sequence of the gradient field in a measurement sequence experiences a time deviation relative to an expected point in time of the switching (which is designated in the following as a "switching dilatation"), this leads to inaccuracies in the spatial resolution of the magnetic resonance signal that cause distortions and other errors in the magnetic resonance imaging of an examination subject.

An association between measured magnetization—from which the aforementioned material properties can be derived—and a spatial coordinate of the measured magnetization typically takes place with the implementation of an intermediate step. In this intermediate step, acquired raw magnetic resonance data are entered into a storage format known as "k-space", wherein the coordinates of k-space are coded as a function of the gradient field. The gradient field modifies the resonance frequency (Larmor frequency) and, for example, also the phase position of the magnetization deflected by an RF pulse in a spatially dependent manner, such that a spatial information is obtained via identification of phase position and resonance frequency of the measured magnetization. In other words, spatial information is based on the coordinate system of k-space (spatial frequency) with phase and frequency coding, and is determined as a function of the gradient field. The magnitude of the magnetization (in particular of the transverse magnetization in a plane defined transverse to the previously described basic magnetic field) at a defined location of the examination subject can be determined from the readout point with a Fourier transformation that calculates the signal strength of the signal in the spatial domain from a signal strength (magnitude of the magnetization) that is associated with a specific frequency (the spatial frequency).

K-space thus forms an inverse Fourier space relative to the spatial domain of the examination subject, such that the magnetic resonance signals are transformed into the spatial domain through a Fourier transformation, in order to create the magnetic resonance image. The gradient field thus defines a point in k-space, and the curve of the change of the gradient field establishes a series of k-space points that can be designated as a "trajectory" through k-space, or as a "projection".

In a disadvantageous case, the aforementioned switching dilatation in current magnetic resonance imaging systems can reach an order of microseconds, and therefore markedly exceed the switching delay of an RF pulse to deflect the magnetization. If this is the case, the gradient field assumes a different value than the expected one at a readout point in time of the raw magnetic resonance data, and a gradient field or a phase position of the spins that corresponds to an expected k-space coordinate is achieved only at a later point in time. This results in the measured magnetic resonance signal being associated with a displaced coordinate in k-space, since the gradient field or the required phase position of the spins at the measurement point in time does not have the expected value.

If a shift of the k-space coordinates of the trajectory takes place due to the switching dilatation so that an approximately coherent shift (explained in more detail later) is present for all trajectories (for example given line-by-line Cartesian sampling of k-space), the switching dilatation has nearly no effect on the quality of the imaging of the examination subject since the additionally arising phase is the same for all k-space points. However, if this is not the case—such as if the sampling of k-space is selected in a particular path through k-space and takes place radially, for example—this inevitably leads to severe artifacts in the imaging. In this case, a correction of the k-space points of the trajectories should take place in order to be able to implement a transformation of the magnetic resonance signals in the positional space of the examination subject while avoiding distortions and image artifacts.

For example, for this a method for correction is known that corrects the k-space points of the trajectories with the aid of a correction value in order to thus avoid image artifacts. The correction value is added by entering the correction method as an input, wherein the input can take place manually or from a database, for example. However, this method is time-consuming or based on general models for the shift due to the switching dilatation, such that significant cost arises in the acquisition of the magnetic resonance imaging and, moreover, the correction does not always occur optimally.

SUMMARY OF THE INVENTION

An object of the present invention is to provide a method to generate magnetic resonance image data of an examination subject as well as a corresponding reconstruction device and a magnetic resonance imaging system that avoid the addressed disadvantages.

According to the invention, a method to generate magnetic resonance image data of an examination subject has the following basic steps.

In an initial step, raw magnetic resonance data of the examination subject are detected in k-space. The raw magnetic resonance data include measurement values at multiple readout points that are arranged along multiple different trajectories in k-space. The detection of the raw magnetic resonance data can be the acquisition and direct processing of the raw magnetic resonance data, or the adoption of already existing raw magnetic resonance data. As mentioned, the trajectories can be regarded as a series of k-space points in the chronological order of the change of the gradient field or of the phase position, with each point representing measurement values of a magnetic resonance signal that are associated with the trajectory, such that every k-space point of the trajectory with its associated measurement value can also be designated as a readout point.

In a further step of the method, the determination of a displacement value (also called an "offset") for each trajectory takes place on the basis of the measurement values of a collection of multiple trajectories. The collection can be predetermined from trajectories.

The method also includes a displacement of readout points of the raw magnetic resonance data by the displacement value along their respective trajectory, such that all readout points of the raw magnetic resonance data are shifted.

In a further step of the method, the magnetic resonance image data are reconstructed on the basis of the displaced or corrected raw magnetic resonance data. As explained in further detail later, the method steps need not necessarily be implemented separately in sequence; rather, they can also be implemented in parallel or overlapping in time in part.

The displacement value can be determined by calculation or counting of values of the respective trajectory as well of the collection of trajectories or the measurement values of the readout points arranged along that trajectory or those trajectories. The values or measurement values can be magnetization data, minimum values, maximum values, coordinates in k-space, priority in an order, and the like.

If a correction of the readout points according to the invention takes place before a transformation of the raw magnetic resonance data into positional space of the examination subject, image errors thus can be avoided, so a significantly improved image quality and a markedly more homogeneous intensity distribution can be achieved by the determination of a displacement value on the basis of the readout points on the trajectories, in particular in specific measurement methods.

A reconstruction device designed according to the invention for magnetic resonance image data of an examination subject, with which reconstruction device this method can be realized, has a raw data interface to acquire raw magnetic resonance data in k-space. The raw magnetic resonance data are measurement values at multiple readout points. The readout points are arranged along multiple different trajectories in k-space. The interface can be designed as software in the reconstruction device or an electronic computer associated with the reconstruction device, and/or as hardware, namely as a device that enables the adoption of raw magnetic resonance data in the reconstruction device.

The reconstruction device also has a displacement value determination unit that determines a displacement value for readout points or raw magnetic resonance data and/or also trajectories on the basis of measurement values of a collection of multiple trajectories. The collection of trajectories can be predetermined. Moreover, the displacement value determination unit can be designed to determine a displacement value for all readout points or trajectories that are acquired to generate magnetic resonance image data of an examination subject.

Furthermore, the reconstruction device has a correction unit that shifts readout points of the raw magnetic resonance data by the displacement value along their respective trajectory.

Finally, the reconstruction device has a reconstruction unit that reconstructs the image data on the basis of the displaced or corrected raw magnetic resonance data.

The invention also encompasses a magnetic resonance imaging system with a reconstruction device according to the invention.

The trajectories preferably proceed radially through k-space. In this case, radially means that the trajectories essentially travel through a common center that preferably forms the origin point of k-space. With this method it is possible to cover k-space with fewer measurement points so that faster measurements can take place. Moreover, the center or the origin of k-space (with which a primary contrast of the magnetic resonance imaging can be associated) is sampled multiple times during the measurement value acquisition, such that the raw magnetic resonance data exist in a more movement-resistant (movement-tolerant) form. On the other hand, it is precisely in this case that image artifacts are particularly strongly expressed due to the switching dilatation. Image errors due to switching delays in the generation of the gradient field then namely occur particularly in the foreground if no coherent displacement of the readout points due to the switching dilatation takes place. This is particularly the case if trajectories proceed through k-space so that they are not equally spaced in at least one dimension of k-space. This is the case for the radial trajectories that have already been mentioned, for example, such that the method of the invention offers particular advantages. For example, the method according to the invention can be applied exclusively to raw magnetic resonance data that are based on multiple trajectories that, at least in one dimension of k-space, are not spaced identically from one another (i.e. run in parallel) over their entire course in k-space.

The displacement value preferably is determined exclusively by calculation or counting of values of the respective trajectory and of the collection of trajectories or the measurement values of the readout points arranged on that trajectory or those trajectories. An input of additional information or correction requests thus can be avoided, for example.

The possibility thus is provided for the determination of a displacement value to take place entirely automatically.

It should be emphasized that an automatic determination of a displacement value from values of a collection of trajectories includes the automatic combination with additional correction parameters, for example from a database. The number of trajectories of the collection of trajectories preferably is below the number of all trajectories that are acquired to generate the magnetic resonance image data. A correction value or displacement value to avoid image artifacts thus can already be determined early at a nearly arbitrary point in time of the acquisition or detection of the raw magnetic resonance data. A number of parallel measurement methods are therefore compatible with the method according to the invention. The requirement is merely that a sufficient, representative collection of trajectories is already acquired for determination of the displacement value, and on the basis of this collection a displacement value is determined so that a marked improvement of the magnetic resonance image data can be achieved.

For example, the collection of trajectories on the basis of which the displacement value is determined can include fewer than half of all trajectories acquired for magnetic resonance imaging of the examination subject in k-space, such that (for example in a preferable parallel method) a displacement value is calculate during the acquisition of all trajectories, and at the same time all trajectories can be corrected accordingly. A particularly pronounced time gain thus results, and moreover a marked improvement of the magnetic resonance image data.

However, it is also encompassed within the invention for the collection of trajectories to include all trajectories that are used later to generate the magnetic resonance image data of the examination subject, meaning that their measurement values are used for reconstruction.

Furthermore, a maximum point, which has a maximum value relative to the measurement values can be determined for each of the trajectories to determine the displacement value. The displacement value then can be determined by counting or calculation on the basis of the maximum point. The maximum value can refer to measurement values of the respective trajectory. For example, the maximum values can include the magnetization, the change of the magnetization, the strength of a magnetic resonance signal, or the change of a magnetic resonance signal, or the like.

The maximum values thus represent an example of a characteristic reference variable, meaning that the maximum points form reference points that allow a synchronization of the spatial frequency of the measurement points on the trajectories. An unambiguous determination of an optimal displacement value is thus enabled.

In a preferred variant, for at least one of the trajectories the displacement value can be established on the basis of a combination of the maximum points of the collection of trajectories as well as a destination point, such that the synchronization of the spatial frequency takes place relative to an established reference value. In particular, the target point can be arranged on the respective trajectory. Moreover, it is also possible for the establishment of a destination point on the respective trajectory to take place by mapping of a common destination point of all trajectories in the respective trajectory.

The destination point for at least one of the trajectories preferably is established on the basis of a relative position of the readout points along the respective trajectory, for example relative to a start point of the respective trajectory. For example, the relative position of the readout points can be determined relative to a start point of the respective trajectory by counting the order of the readout points along the respective trajectory.

A displacement value can be determined in a particularly simple (and thus preferable) manner when the readout points are arranged (in particular are equally spaced) on their respective trajectory according to a rule, i.e. are arranged with a fixed spacing on the trajectories. If a common rule is applied to the readout points on different trajectories, it can also be said that k-space is scanned symmetrically.

In a further preferred variant, a destination point can be established on the basis of a combination of variables of the collection of trajectories (for example the maximum points of the collection of trajectories) to define or, respectively, determine the displacement value for at least one of the trajectories.

Displacement values can be determined or calculated from the intersection points of the trajectory with a destination point that corresponds to an origin coordinate of k-space.

Use can be made of the insight that the maximum value of the measurement values along the trajectory normally can be associated with the intersection point of the trajectory with a destination point that can represent an origin coordinate of k-space. For example, the destination point can be provided as a point at which the magnetization was not affected by the gradient field in at least one dimension of k-space, thus that a gradient field of zero is present, wherein this point conventionally coincides with the origin of underlying k-space.

The maximum values of the measurement values can consequently essentially represent the intersection points of the trajectories with an origin coordinate of k-space in this dimension, wherein the formulation "essentially intersection points" includes a deviation that is determined from a distance in k-space of the readout points of the trajectory. For example, this distance can be determined according to the Nyquist-Shannon sampling theorem, wherein the limit frequency of the Nyquist-Shannon consideration is the highest spatial frequency of k-space.

In the method, for at least one of the trajectories a displacement value can be calculated on the basis of a difference between the destination point and a combination of the maximum points of the collection of trajectories. The displacement value can in principle be an individual, trajectory-dependent displacement value. However, a common displacement value is particularly preferably determined for all trajectories.

An individual, trajectory-dependent displacement value can similarly be established for at least one of the trajectories on the basis of a difference between a defined destination point (advantageously a common destination point as explained above) and the maximum point of the appertaining trajectory.

A common displacement value can thus be determined for all trajectories; however, the individual determination of a displacement value can also respectively be provided for the individual trajectories.

The combination of the maximum points to determine the displacement value and/or the destination point can, for example, take place by the calculation of a mean value of the maximum points of the collection of trajectories. This can be a mean value that is calculated from the relative position of the maximum points on their respective trajectory.

A displacement value or a destination point that can respectively be applied to shift all readout points can thus be determined in a very simple manner on the basis of a mean value with the aid of the collection of trajectories.

For example, the mean value can also be a mean value of the k-space coordinates of the maximum points, or even an arithmetic or geometric mean value that is determined on the basis of the maximum points, such that a simple establishment of common reference values of the displacement can take place.

The displacement of the k-space coordinates by the displacement value preferably already takes place at least in part during the acquisition of additional raw magnetic resonance data, such that an acceleration of the generation of magnetic resonance image data can be achieved again.

This acceleration can be supported in an embodiment of the invention. For example, k-space can be filled with additional raw data on the basis of the acquired raw magnetic resonance data, and the displacement of the k-space coordinates by the displacement value can take place before or during the filling of k-space. The additional raw data can be virtual raw magnetic resonance data, or can be formed thereby, the virtual raw magnetic resonance data being determined with the use of an interpolation or extrapolation method.

The interpolation or extrapolation method is preferably of the type known as a gridding method. Such a gridding method describes filling of k-space in a predetermined grid with calculated raw magnetic resonance data that are derived from the measurement values. Incorrect associations of measurement values with coordinates of k-space thereby lead to an incorrect interpolation or extrapolation, such that a correction of the readout points by the displacement value particularly sensibly takes place before or during the gridding method.

The raw magnetic resonance data preferably are acquired with a gradient echo method. This is based on the realization that, due to a different time dependency of the magnetic resonance signal, sequences known as spin echo (SE)-based acquisition sequences of magnetic resonance imaging are less sensitive to switching delays of the gradient field than gradient echo-based acquisition sequences. In particular, in gradient echo-based sequences the acquisition of the magnetic resonance signal must follow the RF excitation as quickly as possible, such that a switching dilatation that is identical for both sequences—spin echo and gradient echo—causes a greater percentage of time errors in a gradient echo sequence than in a spin echo sequence. It is thus particularly effective to apply the method of the invention in a gradient echo acquisition sequence.

DESCRIPTION OF THE PREFERRED EMBODIMENTS

As explained above, in a magnetic resonance imaging system switching delays of gradient coils that generate a gradient field for spatial resolution of magnetic resonance signals can lead to severe reconstruction errors of the magnetic resonance image data in positional space of an examination subject. These reconstruction errors can be reduced, and the magnetic resonance image can thereby be improved, with the aid of the method according to the invention for the generation of magnetic resonance image data.

In particular, the reconstruction errors are based on an incorrect determination of k-space coordinates for measured magnetic resonance signals. An incorrect determination of the k-space coordinates results from the fact that gradient field are generated with a time delay relative to an expected point in time (switching dilatation), such that a gradient field expected at a spatial frequency k is generated with a delay by a displacement value dk, as is shown in FIG. 1, for example.

Figure 1:
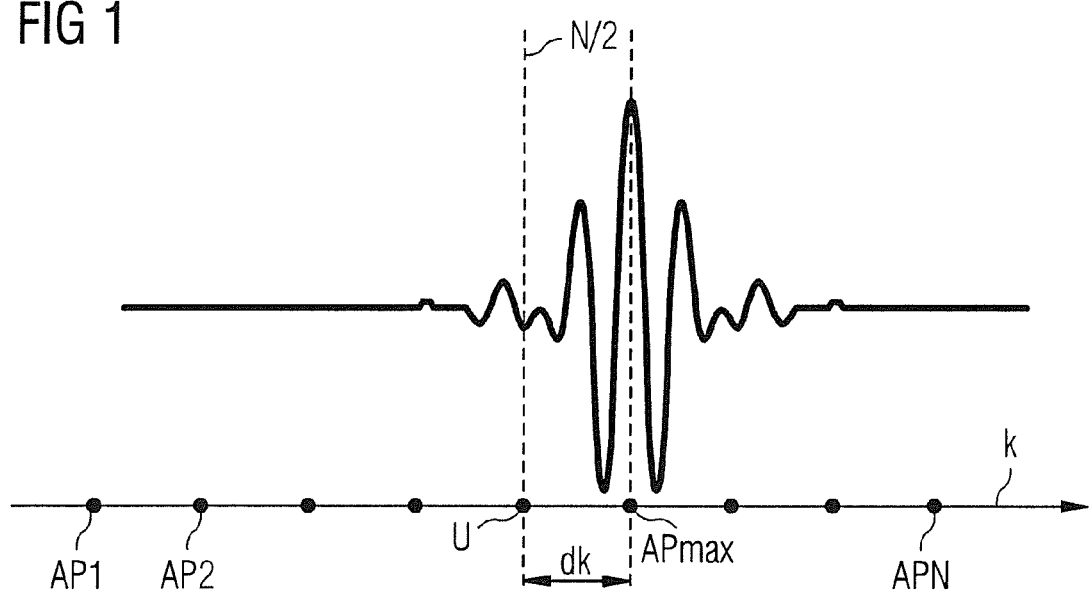
FIG. 1 shows the displacement of a magnetic resonance signal due to the time delay upon switching the gradient coils.
Figure 11:
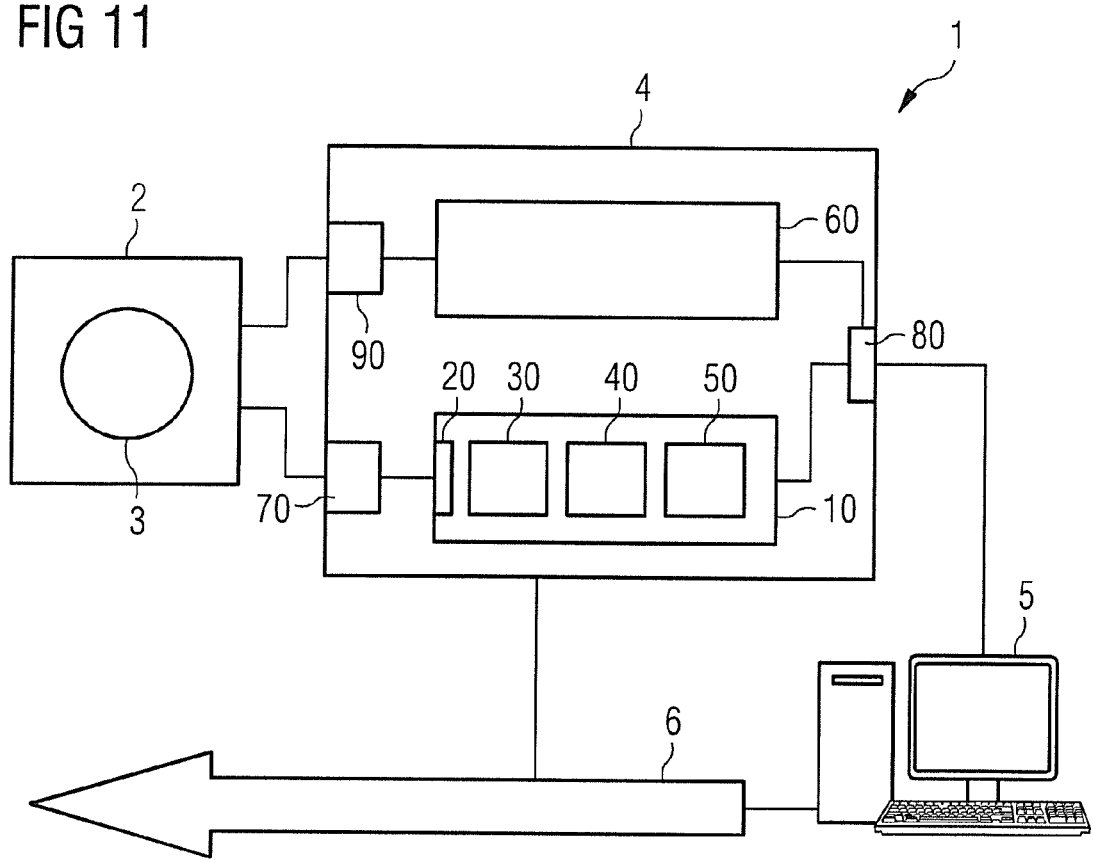
FIG. 11 illustrates an exemplary embodiment of a magnetic resonance imaging system that includes an exemplary embodiment of a reconstruction device according to the invention.

In the magnetic resonance imaging system explained in more detail using FIG. 11, according to FIG. 1 measurement values for a series of N readout points AP1, AP2, . . . , APN through k-space are acquired along a trajectory (here a straight line through k-space). In the shown case, it is assumed or, respectively, expected that the origin coordinate of k-space at which the gradient field is zero lies at a k-space coordinate that is associated with a readout point or, respectively, a destination point U that can be represented by a count value N/2. What is hereby understood by a "count value" is the relative position of the respective readout point AP1, AP2, . . . , APN by counting the readout points along the appertaining trajectory, starting from a "start point" (the first readout point on the appertaining trajectory). This means that here the destination point U is correspondingly described by counting readout points along the shown trajectory through k-space, such that the destination point U is established by a half value N/2 of the number N of readout points AP1, AP2, . . . , APN of the trajectory. In this case, the readout points AP1, AP2, . . . , APN of the shown trajectory are arranged following one another in a fixed spacing on the trajectory. In the following, this is assumed for all trajectories.

FIG. 1 shows as an example a magnetic resonance signal in the form of an echo signal (SE or GRE, for example) from which measurement values at multiple readout points AP1, AP2, AP3, . . . , APN of the trajectory are derived. As has already been explained, given a gradient field of zero it is expected that a maximum value of a measurement value (in this case of the associated gradient echo signal) is acquired. For the readout point with which the maximum value is associated—a maximum point APmax—an acquisition is consequently actually expected at a count value N/2, thus at the destination point U.

However, if the acquisition of this echo signal takes place somewhat delayed due to the switching dilatation, the measurement value to be associated with the real destination point in k-space is accordingly not acquired as expected at the count value N/2, and every readout points [sic] is shifted by a distance dk along the trajectory.

If this error is not corrected in the reconstruction of the image, this leads to the situation that the acquired values do not match one another, and severe artifacts can arise in the reconstructed magnetic resonance image.

Figure 2:
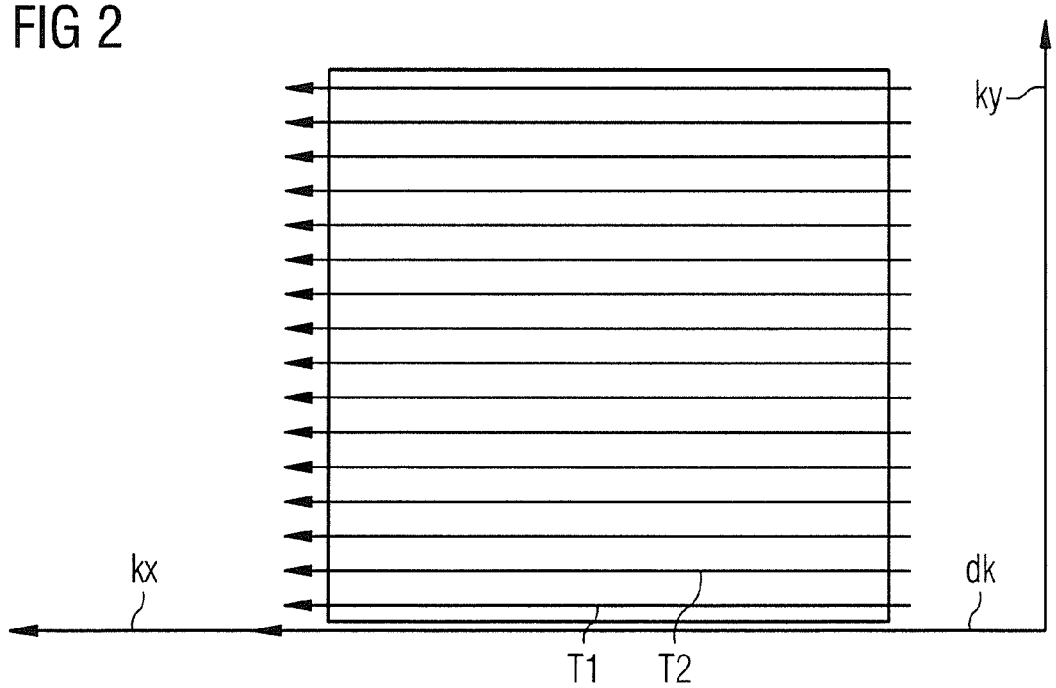
FIG. 2 shows an exemplary embodiment of the arrangement of trajectories in k-space.

An example of trajectories through k-space that usually lead to only slight artifacts in the reconstruction of the magnetic resonance image (as will be explained in the following) is presented in FIG. 2, such that typically no correction of the readout points to compensate for switching dilatations of the gradient field is implemented for these trajectories. Nevertheless, the method according to the invention can also be used in connection with these trajectories and entail an improvement of the magnetic resonance image.

The base vectors kx and ky (based on k-space shown in FIG. 2) and the trajectories T1, T2, . . . describe paths or, respectively, straight lines in k-space that are spaced equally apart from one another and travel parallel to one another. K-space is scanned in a "Cartesian" manner via these trajectories or—in an alternative formulation—the trajectories follow coordinate lines of a Cartesian coordinate system that, for example, can be described by the basic vectors kx and ky. In the shown exemplary embodiment, the switching dilatation of the gradient field means a shift by the displacement value dk parallel to the base vector kx for all trajectories. This does not change significantly at the separation of the coordinate lines or, respectively, trajectories (and therefore at the separation of the readout points) relative to one another, and the shift of the readout points is thus coherent. For the magnetic resonance signals transformed in the positional space of the examination subject—thus the Fourier-transformed magnetic resonance signals—this means that the magnetic resonance image is essentially unaffected by the switching dilatation.

However, this is not always ensured if, for example individual trajectories experience a particularly severe switching dilatation for any reason, such that—even for magnetic resonance images whose readout points are arranged in a Cartesian manner in k-space—the method according to the invention means a possibility to improve the magnetic resonance image, in particular automatically. The automatic method thereby corresponds to the steps shown later.

Figure 3:
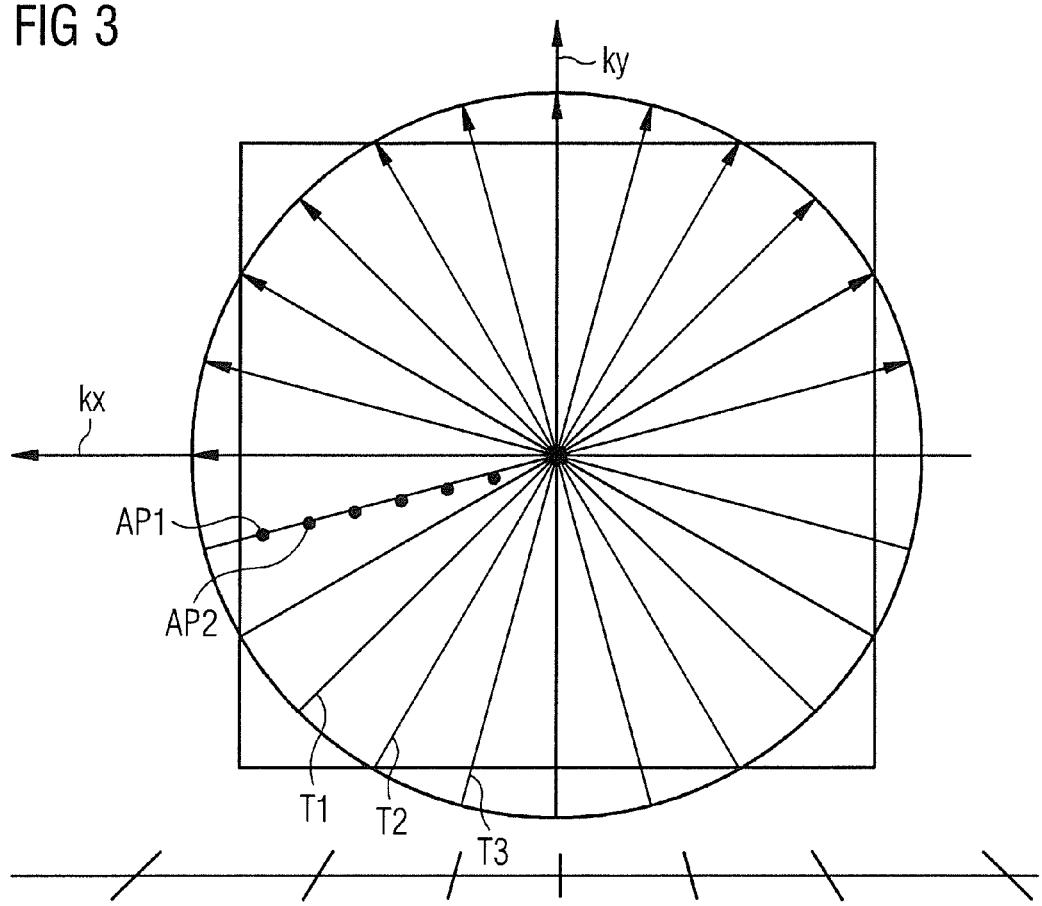
FIG. 3 shows an additional exemplary embodiment of the arrangement of trajectories in k-space.

However, the advantages of the method according to the invention become particularly clear given magnetic resonance images that are based on radial trajectories T1, T2, . . . through k-space, and in particular those that are shown in FIG. 3. These radial trajectories T1, T2, . . . can in particular (as here) have a common intersection point or, respectively, a common center in k-space. As is apparent from the section of the trajectories T1, T2, . . . with a base line in the kx-direction of FIG. 2, the trajectories T1, T2, . . . have different distances from one another.

Given an incorrect association of the acquired values do not match one another, this means that a coherent shift is not present since the distances between readout points on different trajectories in k-space inevitably also change in the most varied ways given a shift of the readout points AP1, AP2, . . . , APN along the trajectory in the radial direction. Ignoring the switching dilatation thus causes a nearly unusable magnetic resonance image. The method according to the invention can be combined with magnetic resonance imaging methods that are based on a radial scanning of k-space. In this case and in the following, the radial trajectories T1, T2, . . . through k-space are designated as projections.

This problem is further explained with the aid of figures described in the following, in particular FIG. 4, which shows a magnetic resonance image of a rectangular phantom. This magnetic resonance image is based on readout points that are acquired in projections which travel radially through k-space. Schematically and reproduced in part, these projections T1, T2, T3, . . . are presented as has already been described in FIG. 3. The raw data here were recorded with a gradient echo method in which the switching dilatation can lead to particularly pronounced artifacts. As is apparent, the basic rectangular shape is nearly entirely blurred due to the switching dilatation.

Figure 4:
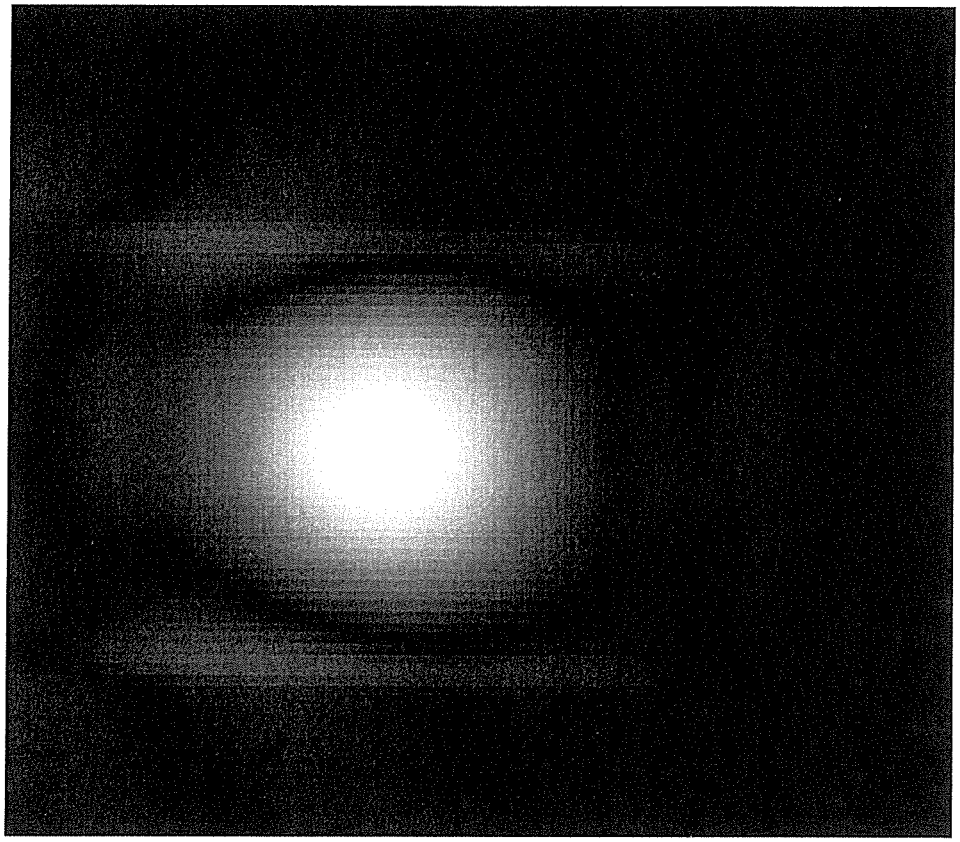
FIG. 4 is an uncorrected magnetic resonance image of a phantom.
Figure 5:
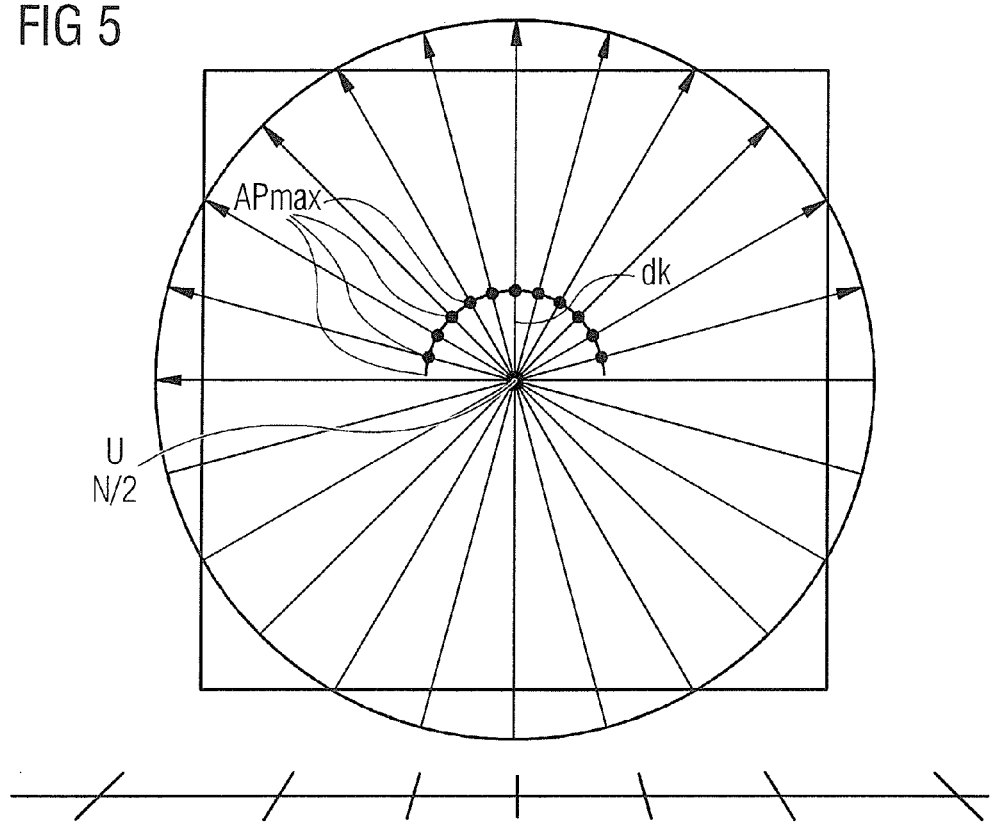
FIG. 5 schematically illustrates a displacement of the trajectories in k-space due to the time delay of the switching of the gradient coils.

From FIG. 5 (which shows projections through k-space that are identical to FIGS. 3 and 4) and in connection with FIG. 1, it is clear that, due to the switching dilatation, a measurement value for each of the projections is acquired at a readout point that corresponds to a spatial frequency k+dk in k-space.

Figure 6:
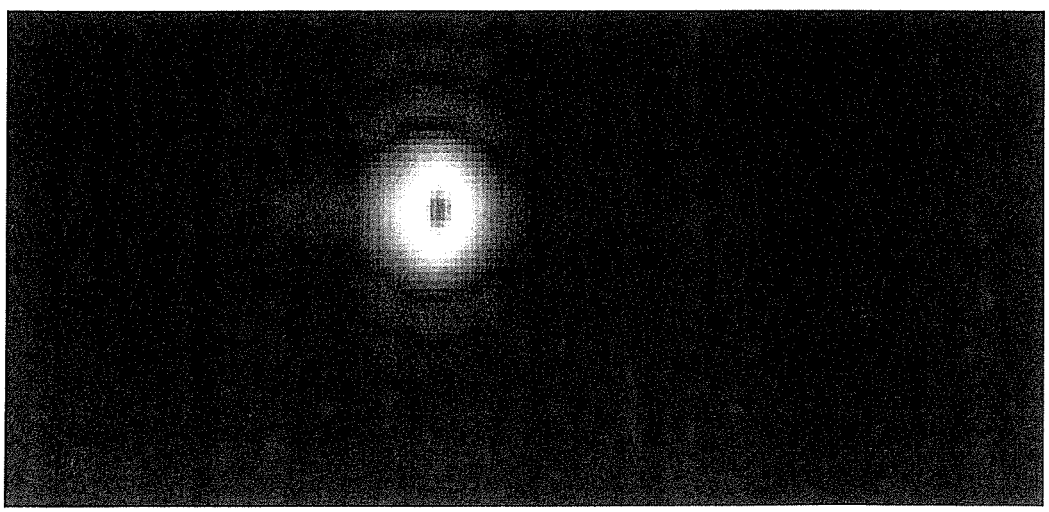
FIG. 6 shows the displacement of a maximum absolute value of the measurement values in k-space.

This is explained in the following in an example for maximum points APmax of the respective trajectory; the maximum points APmax of the respective trajectories for measurement values that respectively correspond to an actual spatial frequency k=0 or, respectively, a gradient field equal to 0 are arranged in a semicircle or, respectively, a circle around the intersection point of the projections, thus around the assumed origin coordinate that forms the basis of k-space if the switching dilatation were not present. In this case, the measurement values were not coherently shifted in k-space, and the measurement values of the common origin coordinate of unshifted k-space is [sic] acquired at readout points that correspond to multiple different spatial frequencies k. FIG. 6 shows k-space belonging to the magnetic resonance exposure in FIG. 4. Clearly apparent here is the previously described effect that the measured signal maxima (i.e. the maximum points APmax) are not situated in the center of k-space but rather are shifted in a radial direction, which in turn leads to the distortions or, respectively, artifacts in positional space (i.e. in the image data) that are apparent in FIG. 4.

Before the transformation of the magnetic resonance signal into the spatial domain of the examination subject, it is thus necessary to determine a common, correct origin coordinate for the measured trajectories or projections, or, respectively, the measurement values that actually correspond to identical spatial frequencies, and to also associate these with approximately identical spatial frequencies k.

For this purpose, in the exemplary embodiment a correction of raw magnetic resonance data is implemented in k-space according to the following method.

First, a reduced cohort of radial projections is acquired in k-space sown in FIG. 4, on the basis of which a displacement value dk can already be determined. In the exemplary embodiment, the count of this cohort of projections is predetermined at, for example, half of the projections acquired in k-space for imaging, and thus falls below the count of projections (typically up to 30% of the total number of projections) that are scanned in total to acquire all raw data for the image reconstruction in the raw data acquisition.

As is clear from the echo signal shown in FIG. 1, the offset generated in k-space by the unintended time delay can be defined as a difference between the readout point with the maximum amplitude (the maximum point APmax) and a point in time U at which this maximum value would actually be expected without time delay.

Since—given radial projections—it is to be assumed that this destination point U should coincide with the origin of k-space, the destination point U can advantageously be established as represented in FIG. 1 by a count value N/2, thus by the relative position of the destination point U on the respective trajectory. This is possible in a particularly simple manner without significant calculation operations, in particular if a symmetrical scanning of k-space exists.

Alternatively, however, the destination point U could also be established on the basis of a combination of measurement values of the cohort of projections, in particular of the maximum points. For example, the destination point U can be formed by a geometric center of the maximum points APmax of the cohort of projections. For example, the geometric center can be determined similar to a focal point calculation with the aid of the maximum points APMax. The destination point determination can thereby be more precise but requires more computational effort.

In a preferred variant, the displacement value dk can be determined via the difference between a combination of the maximum points of the initially measured cohort of projections and the destination point U.

Figure 7:
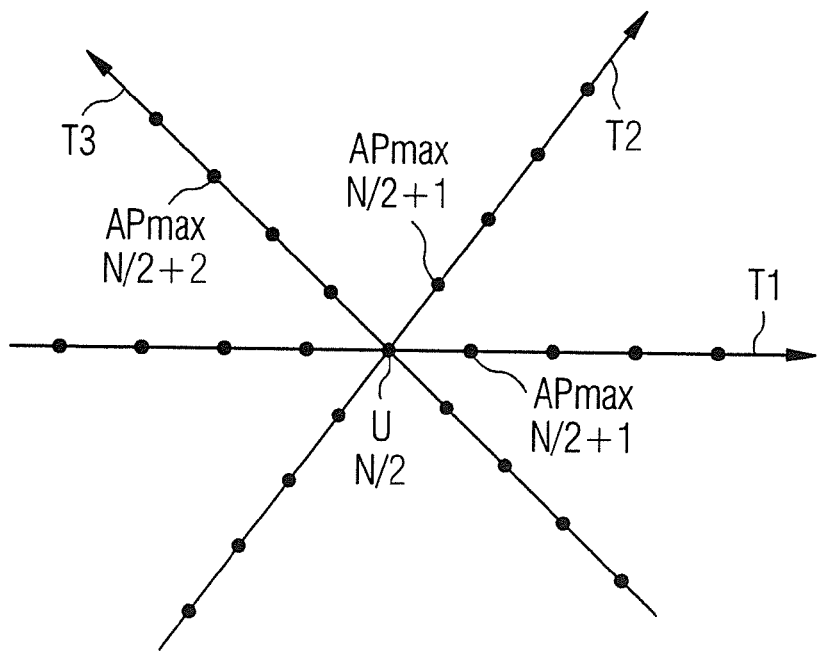
FIG. 7 shows an exemplary embodiment of the calculation of a displacement value.
Figure 8:
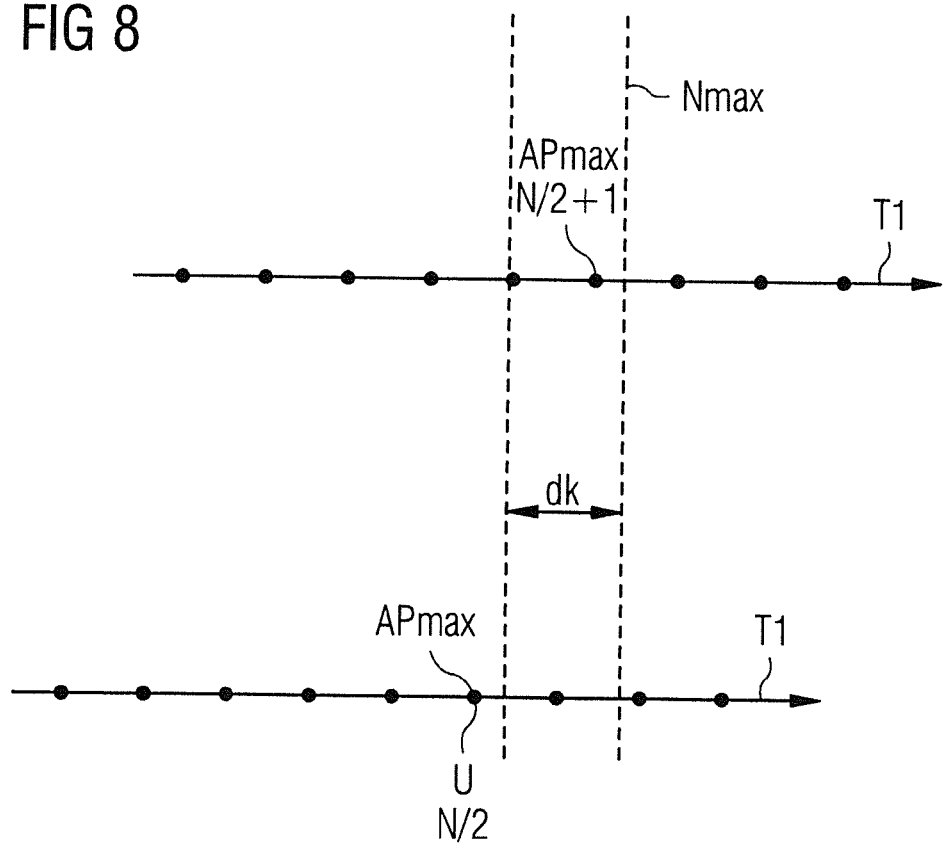
FIG. 8 shows an exemplary embodiment of the correction of readout points.

FIGS. 7 and 8 show the calculation of the displacement value dk on the basis of a mean value for this. From the count values of the maximum points APmax of the cohort of projections that, as described, represent a relative measure with regard to the start point of the trajectory, a mean value Nmax is calculated that then describes a relative, average position of the maximum points with regard to the respective start point of the associated projection.

Shown as examples in FIG. 7 are three projections T1, T2, T3 on the basis of which the calculation of the displacement value dk can already take place. For each of the projections T1, T2, T3, a maximum point APmax in the form of a count value is determined, wherein the count values of the maximum point APmax here respectively have the values N/2+1, N2+1 and N/2+2 for the projections T1, T2, T3. The mean value Nmax that describes a mean count value of the maximum points APmax is thereby calculated from a mean value of these count values and amounts to N/2+4/3.

At this point it is to be emphasized that, as an alternative or in addition to the count values, other relative measures with regard to the readout points (in particular the start point) of a trajectory can be used, for example in order to define points on a trajectory between the readout points. Among other things, as in the example of the mean value of the maximum points APmax fractions of the separation of readout points can also be described as relative measurements or relative positions on the projection in order to form a continuous relative measurement. For example, a normalized absolute value of the gradient field along the trajectory or the like can also be assumed as an alternative relative measurement.

The displacement value dk is calculated in the following by finding the difference of the mean value Nmax from the destination point U. This is explained in an example in FIG. 8 for the projection T1. The projection T1 shown in the upper region of FIG. 8 thereby represents raw magnetic resonance data that have an incorrect association of measurement values due to the switching dilatation. For the shown projection T1, the switching dilatation (described as a count value) amounts to +1, as can easily be established using the maximum point APmax that is shifted from N/2 to N/2+1. In this case, the displacement value dk (thus the difference between the mean value Nmax and the destination point U with which the count value N/2 is associated and that corresponds to the k-space center) amounts to $$dk = N/2 - N\max = -4/3.$$

This difference is associated with the displacement value dk, such that this is established in fractions of the intervals of the readout points of the respective projection.

In a subsequent step, the readout points of the raw magnetic resonance data are shifted by the displacement value dk, as this can be learned by way of example from the projection T1 shown in the lower region of FIG. 8. The displacement by the previous described difference of −4/3 now associates a relative measure of −1/3 with the maximum point APmax. A marked improvement of the association of measurement values with readout points is apparent. In the presentation and calculation (schematically limited to only three projections), the small remaining deviation of −1/3 relative to a deviation of +1 before the displacement by dk already means an improvement of 60% for the shown projection T1. In the realization, the method can mean an even more marked advantage in the association of measurement values with spatial frequencies relative to the schematic calculation, for example if the determination of the mean value is expanded to a larger cohort of projections.

Due to the establishment of the displacement value dk as a relative measure, the displacement value dk can be applied without modification to all projections, such that now the readout points of all projections are shifted by the determined displacement value dk. If as only a displacement in the gridding of the readout points should take place, the determined displacement value can also be rounded to the nearest whole number.

In an alternative variant it is possible to calculate the difference of an individual, trajectory-dependent APmax between the destination point U and the maximum point, and based on this difference to establish an individual, trajectory-dependent displacement value dk.

Figure 9:
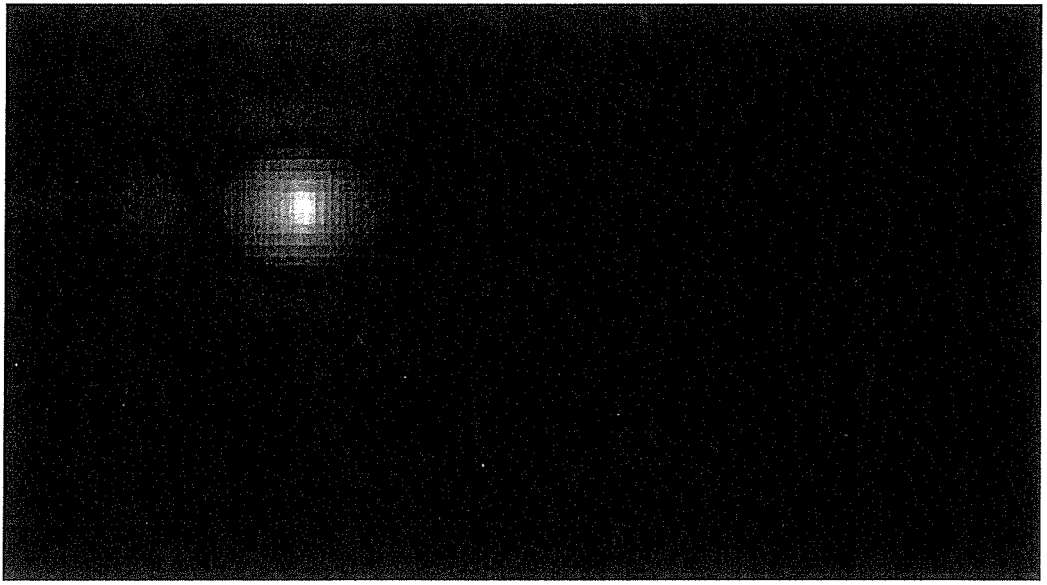
FIG. 9 shows the correction of the maximum absolute value of the measurement values at a destination point.
Figure 10:
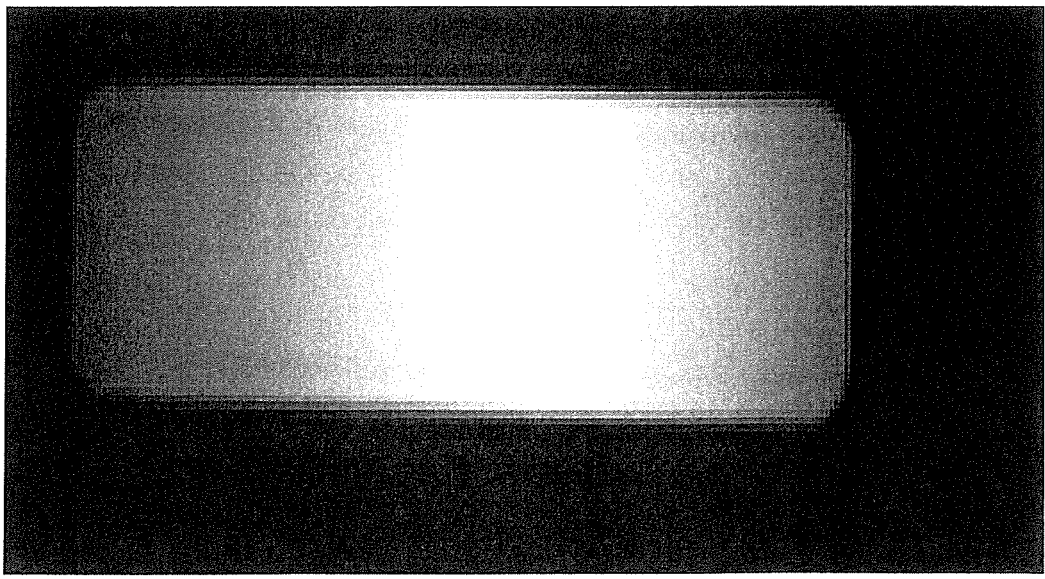
FIG. 10 is a magnetic resonance image of the phantom of FIG. 3, corrected with the aid of an exemplary embodiment of the method according to the invention.

The improvement of the raw data in k-space is explained in FIG. 9. This concerns the same raw data as in FIG. 6, but after the correction according to the invention. As is apparent, the maximum point APMax are [sic] better concentrated at the k-space center. FIG. 10 shows the magnetic resonance image data reconstructed on this basis. A comparison with FIG. 3 clearly shows the improved depiction of the phantom.

After calculation of the displacement value dk, additional raw magnetic resonance data can be acquired so that the displacement of the readout points by the displacement value dk already takes place at least in part during the acquisition of additional raw magnetic resonance data. The possibility to combine the method with other methods of magnetic resonance imaging—for example radial EPI or (T)SE sequences—can thereby be improved.

In the exemplary embodiment described in the preceding, the determination of the displacement value dk takes place only on the basis of a predetermined, reduced cohort of projections. Alternatively, however, all projections of the displacement value determination that are acquired to generate the magnetic resonance image data can also be used.

To optimize the magnetic resonance imaging, before transformation of the measurement values into positional space of an examination subject an interpolation method is applied that calculates measurement values interpolated or extrapolated from the magnetic resonance signals in a defined grid in k-space. This is designated as a gridding method and describes filling of k-space with additional, virtual raw data on the basis of the acquired raw magnetic resonance data.

Due to the previously described switching dilatation, k-space points can appear to be adjacent or separated (as this is clear from the displacement of the origin coordinate in FIG. 5, for example) although they correspond to a single point in k-space. The gridding method is thus severely error-prone, such that a correction of the switching dilatation by the displacement value dk advantageously takes place before or during the gridding method, thus before or during the filling of k-space.

In the exemplary embodiment mentioned above, the method is automatically applied after acquisition of the predetermined cohort of projections (thus before the aforesaid gridding method) in order in particular to realize a time savings. Alternatively, the displacement value dk can be considered in an algorithm of the gridding method so that the displacement takes place during said gridding method. This offers the advantage that even three-dimensional reconstructed magnetic resonance image data can be improved particularly easily with the method.

Finally, in FIG. 11 a magnetic resonance imaging system 1 (MR system in the following) is shown with a reconstruction device 10, wherein said reconstruction device 10 is hereby a reconstruction device 10 according to the invention.

The MR system 1 has a typical MR scanner (data acquisition unit) 2 in which a patient bed is accommodated in an examination tunnel 3, on which patient bed an examination subject (for example a patient or test subject) can be positioned (not shown).

The scanner 2 as well as the patient bed are controlled by a control device 4. This can hereby be a typical central control computer. This is equipped with a corresponding control interface 90 as well as a measurement control unit 60. This measurement control unit 60 controls the scanner 2 according to a predetermined measurement protocol to implement a measurement.

The control interface 90 here is depicted merely as a block. However, it is clear that this interface 90 normally includes a number of individual interfaces in a medical technology system. Among these are, for example, interfaces to control the gradient system, a radio-frequency transmission system to emit the radio-frequency pulses etc. Furthermore, this control interface 90 also comprises an interface in order to pass control signals to the patient bed.

The raw MR data acquired by the scanner 2 are accepted by the control computer 10 via a reception interface 70. This interface 70 can also comprise multiple sub-interfaces. The raw data are then passed to the reconstruction device 10 which reconstructs image data from these in the manner according to the invention that is explained above, which image data are then (for example) displayed at a monitor of a terminal 5 on site and/or are stored in a memory and/or are passed via a network interface to a data bus 6 via which the imaging system 1 is connected with other devices within a network, for example in order to store measurement data or finished, reconstructed image data in large mass storage systems or to transmit them to finding stations or the like.

The control of the entire MR system 1 by an operator takes place via the terminal 5, which is connected with the central control unit 10 via a terminal interface 80. For example, with the aid of this terminal 5 and a user interface realized there it is possible that the operator selects a measurement protocol from a memory (not shown), adapts it as necessary and ensures that the measurement control unit 60 outputs corresponding control signals on the basis of this protocol via the control interface 90 to the scanner 2 so that the measurement can be implemented.

As noted, the raw data acquired by the scanner 2 are passed to the reconstruction device 10 via the raw data interface 20.

Here the reconstruction device 10 furthermore has a displacement value determination unit 30 that is designed to determine the displacement value dk according to the method according to the invention.

Moreover, the displacement value 10 has a correction unit 40 to displace the raw data by the displacement value dk.

Furthermore, the reconstruction device 10 has a reconstruction unit 50 that is designed to reconstruct the magnetic resonance image data on the basis of the corrected raw data.

The central control unit 4 does not necessarily need to be designed as an integral unit (as shown here); rather, it can also be formed from many separate units which are networked among one another in a suitable manner. A plurality of components can also be realized in the form of software at suitable microcontrollers. This in particular applies for the displacement value determination unit 30, the correction unit 40 and the reconstruction unit 40 or, respectively, their sub-modules. They can if necessary be realized jointly with additional components at one or more computers (microcontrollers, for example) that belong to the control unit 4. Alternatively, however, these components can be designed as software modules of a superordinate reconstruction software module. The reconstruction device 10 (or individual components of it) is particularly preferably designed so that the correction method is integrated into the algorithm of the gridding method.

According to the invention, the reconstruction device 10 can exist outside of such a central control unit for control of the scanner 2. In this case, the raw data are directly passed to the reconstruction device 10 via a network, for example. In particular, the image reconstruction device can be part of the terminal 5 insofar as this has a suitable computing power.

It is also noted that the central control device 4 and the scanner can have a number of additional components that a magnetic resonance system typically has. However, all of these components as well as the basic functionality of such imaging systems are known to those skilled in the art and therefore not need be explained in detail herein.

The invention provides effective possibilities which markedly improve magnetic resonance imaging.

Finally, it is noted that the method, the reconstruction unit and the magnetic resonance imaging system that are described in detail in the preceding are merely exemplary embodiments that can be modified in the most varied manner by those skilled in the art without leaving the scope of the invention. For example, the method can be applied to raw data that describe an examination subject in three dimensions, in particular such that a mean calculation or a difference calculation takes place in three-dimensional k-space. This can be taken into account in a filling of three-dimensional k-space with virtual raw magnetic resonance data, for example in that common reference points or, respectively, reference variables and/or destination points U are established for multiple scanned planes of three-dimensional k-space. In particular, it should be noted that the features of all exemplary embodiments or developments disclosed in the figures can be used in arbitrary combinations.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate magnetic resonance image data of an examination subject, comprising:
    acquiring raw magnetic resonance data in a memory representing k-space, said raw magnetic resonance data comprising measurement values at multiple readout points at which said magnetic resonance data was readout from an examination subject, said multiple readout points being organized in k-space along multiple different trajectories in k-space;
    in a processor having access to k-space in said memory, automatically determining a displacement value for each trajectory among said multiple different trajectories based on measurement values of a collection of said multiple different trajectories;
    in said processor, displacing, within and along each trajectory, said readout points of the raw magnetic resonance data in k-space by said displacement value, thereby producing displaced raw magnetic resonance data; and
    in said processor, reconstructing image data of the examination subject based on the displaced raw magnetic resonance data, and making said image data available as a data file at an output of said processor.

2. A method as claimed in claim 1 comprising organizing said multiple different trajectories in k-space so as to proceed radially through k-space.

3. A method as claimed in claim 1 comprising determining said displacement value solely by calculation or counting of at least one of values of the respective trajectory and the collection of multiple different trajectories, and measurement values of the readout points on the respective trajectory or trajectories.

4. A method as claimed in claim 1 comprising determining a maximum point having a maximum value among said measurement values, and determining said displacement value based on said maximum point.

5. A method as claimed in claim 4 comprising establishing said displacement value for at least one of said trajectories as a combination of maximum points respectively for the collection of multiple different trajectories, and a destination point on the respective trajectory.

6. A method as claimed in claim 5 comprising establishing said destination point for at least one of said trajectories based on a relative position of the readout points along said at least one of said trajectories.

7. A method as claimed in claim 4 comprising establishing said destination point for at least one of said trajectories based on a combination of maximum points of the collection of multiple different trajectories.

8. A method as claimed in claim 7 comprising establishing, for said at least one of said trajectories, a trajectory-dependent displacement value based on a difference between said destination point and the maximum point of said at least one of said trajectories.

9. A method as claimed in claim 1 comprising organizing said readout points in k-space with identical spacing from each other along at least one dimension of k-space, according to a predetermined rule.

10. A method as claimed in claim 1 comprising selecting a number of trajectories in said multiple different trajectories that is less than a number of all trajectories that are acquired to generate said magnetic resonance image data.

11. A method as claimed in claim 1 comprising displacing said readout points by said displacing value at least in part during acquisition of additional raw magnetic resonance data.

12. A method as claimed in claim 1 comprising filling k-space with additional raw data based on the acquired raw magnetic resonance data and displacing k-space coordinates by said displacement value before or during filling of k-space.

13. A method as claimed in claim 1 comprising acquiring said magnetic resonance data by operating a magnetic resonance data acquisition unit with a gradient echo sequence.

14. A reconstruction device to generate magnetic resonance image data of an examination subject, comprising:
   a raw data interface configured to acquire raw magnetic resonance data in a memory representing k-space, said raw magnetic resonance data comprising measurement values at multiple readout points at which said magnetic resonance data was readout from an examination subject, said multiple readout points being organized in k-space along multiple different trajectories in k-space;
   a displacement value determination unit having access to k-space in said memory, configured to automatically determine a displacement value for each trajectory among said multiple different trajectories based on measurement values of a collection of said multiple different trajectories;
   a correction unit configured to displace, within and along each trajectory, said readout points of the raw magnetic resonance data in k-space by said displacement value, thereby producing displaced raw magnetic resonance data; and
   a reconstruction unit configured to reconstruct image data of the examination subject based on the displaced raw magnetic resonance data, and making said image data available as a data file at an output of said reconstruction unit.

15. A magnetic resonance imaging system comprising:
   a magnetic resonance data acquisition unit; and
   a reconstruction device comprising a raw data interface in communication with said data acquisition unit, configured to require raw magnetic resonance data in a memory representing k-space, said raw magnetic resonance data comprising measurement values at multiple readout points at which said magnetic resonance data was readout from an examination subject, said multiple readout points being organized in k-space along multiple different trajectories in k-space, a displacement value determination unit having access to k-space in said memory, configured to automatically determine a displacement value for each trajectory among said multiple different trajectories based on measurement values of a collection of said multiple different trajectories, a correction unit configured to displace, within and along each trajectory, said readout points of the raw magnetic resonance data in k-space by said displacement value, thereby producing displaced raw magnetic resonance data, and a reconstruction unit configured to reconstruct image data of the examination subject based on the displaced raw magnetic resonance data, and making said image data available as a data file at an output of said reconstruction unit.

\* \* \* \* \*